United States Patent
Hojoh et al.

(10) Patent No.: US 6,869,574 B2
(45) Date of Patent: Mar. 22, 2005

(54) APPARATUS AND METHOD OF GENERATING CHARGED PARTICLES

(75) Inventors: Hisao Hojoh, Musashino (JP); Masatoshi Ono, Tsukuba (JP); Morinobu Endo, Suzaka (JP); Tetsuo Uchiyama, Koganei (JP)

(73) Assignee: Vacuum Products Corporation, Tokyo (JP)

( * ) Notice: Subject to any disclaimer, the term of this patent is extended or adjusted under 35 U.S.C. 154(b) by 406 days.

(21) Appl. No.: 10/091,539
(22) Filed: Mar. 7, 2002

(65) Prior Publication Data

US 2002/0130039 A1 Sep. 19, 2002

Related U.S. Application Data

(60) Provisional application No. 60/275,471, filed on Mar. 14, 2001.

(30) Foreign Application Priority Data

Jan. 30, 2002 (JP) .......................................... 2002-21641

(51) Int. Cl.[7] ............................................... B01J 19/08
(52) U.S. Cl. ............. 422/186; 422/186.04; 422/186.21; 422/186.22; 422/186.28
(58) Field of Search ........................... 422/186, 186.04, 422/186.21, 186.22, 186.28

(56) References Cited

U.S. PATENT DOCUMENTS

| | | | | |
|---|---|---|---|---|
| 5,041,732 A | * | 8/1991 | Saito et al. | 250/396 ML |
| 5,938,041 A | * | 8/1999 | Stencel et al. | 209/127.4 |
| 6,320,319 B1 | * | 11/2001 | Iwai et al. | 315/106 |

OTHER PUBLICATIONS

Endo, "Grow carbon fibers in the vapor phase", CHEMTECH. Sep. 1988, pp. 568–576.

* cited by examiner

Primary Examiner—Steven Versteeg
(74) Attorney, Agent, or Firm—Oliff & Berridge, PLC (57) ABSTRACT

A charged particle generating method in which mode is changeable between an ion generation mode and an electron generation mode. In the ion generation mode, a raw material is supplied to a tip end of a charged particle generating electrode through a raw-material passage formed in the charged particle generating electrode. A first electric field, in which the charged particle generating electrode is positive and the charged particle extract electrode is negative, is generated to emit ions from the raw material at the charged particle generating electrode. In the electron generation mode, supplying the raw material from the raw-material supply section is stopped. A second electric field, in which the charged particle generating electrode is negative and the charged particle extract electrode is positive, is generated to emit electrons from the raw material at the charged particle generating electrode.

14 Claims, 7 Drawing Sheets

APPARATUS AND METHOD OF GENERATING CHARGED PARTICLES

This application claims the benefit of, and incorporates by reference all the contents of U.S. patent application Ser. No. 60/275,471 filed on Mar. 14, 2001 and Japanese Patent Application No. 2002-21641 filed on Jan. 30, 2002.

BACKGROUND OF THE INVENTION

The present invention relates to an apparatus and method of selectively generating charged particles in which one of or both of ions and electrons are generated.

In the conventional ion source having a needle electrode, a vacuum (e.g., about $10^{-8}$ Pa) was created around the needle electrode. A gaseous raw material was supplied to the tip end of the needle electrode at room temperature. Thus, the vacuum around the needle electrode was reduced to about $10^{-2}$ Pa. The needle electrode was cooled depending on the type of ion to be generated. The gaseous raw material was liquefied and ionized by a strong electric field between the needle electrode and an extract electrode. Thus, a cooling device for liquefying the raw material was essential in the prior art. Moreover, the prior art wasted the supplied raw material since it most flowed into the vacuum/exhaust system.

In recent years, there is a large demand for a single device for emitting both the electron and ion beams in the field of nanotechnology. For example, drawing or machining will be carried out by selectively using the property of electron or ion beam. Alternatively, a drawing or ion-injecting process using the ion beam may be monitored by the electron beam.

In the latter case, an electron may be emitted from the needle electrode after the supply of raw material from the ion source has stopped. Since the raw material has adhered on the tip end of the needle electrode, however, it is required that any heating mechanism is used to remove the adhered substances and to emit an electron from the clean face of the needle electrode.

In such a manner, when the needle electrode is used as an ion source, it is cooled. When the needle electrode is used as an electron source, it is heated. As a result, the temperature of the needle electrode must rapidly be changed, for example, within a range around several K to 200 K. This requires any cooling device such as a tank containing liquid helium or nitrogen or any refrigerator, as well as any heating device.

The atmospheric pressure around the needle electrode is $10^{-8}$ Pa when it is used as an electron source. When the needle electrode is used as an ion source, the pressure around the needle electrode may be, for example, about $10^{-2}$ Pa depending on the gaseous raw material. To realize such different pressures in a rapid manner, a turbo-molecular pump (or oil diffusion pump) resistible any increased load is required. In addition, difficulties in operation and higher cost are unavoidable for such of differential pumping system.

BRIEF SUMMARY OF THE INVENTION

The present invention may provide a charged particle generating apparatus and method using a novel and improved structure suitable for use in one of or both of the ion and electron sources.

The present invention may further provide a charged particle generating apparatus and method which can ionize a raw material without cooling it down to its liquefaction point.

The present invention may further provide a charged particle generating apparatus and method which can ionize a raw material with high efficiency.

The present invention may further provide a charged particle generating apparatus and method which can generate a bright electron beam by supplying raw material.

The present invention may further provide a charged particle generating apparatus and method which can generate an electron beam with an increased current density independently of the material forming a charged particle generating electrode.

The present invention may still further provide a charged particle generating apparatus and method which can only use a single device by selectively switching between ion source and electron source.

To this end, one aspect of the present invention provides a charged particle generating apparatus comprising: a charged particle generating electrode including a raw-material passage formed therethrough, the raw-material passage extending from a base end to a free end of the charged particle generating electrode; a raw-material supply section connected to the base end and supplying a raw material to the raw-material passage of the charged particle generating electrode; and a charged particle extract electrode which generates an electric field between the charged particle extract electrode and the free end of the charged particle generating electrode.

According to this aspect of the present invention, the raw material is conducted from the raw-material supply section into the free end (or tip end) of the charged particle generating electrode through the raw-material passage formed in the charged particle generating electrode itself. Since the electric field is generated between the free end of the charged particle generating electrode and the charged particle extract electrode, charged particles are emitted from the raw material at the free end.

The charged particles are ions or electrons depending on the direction of the electric field.

An ion may be emitted from the raw material at the free end of the charged particle generating electrode by generating the electric field in which the charged particle generating electrode is positive and the charged particle extract electrode is negative.

On the contrary, an electron may be emitted from the raw material at the free end of the charged particle generating electrode by generating the electric field in which the charged particle generating electrode is negative and the charged particle extract electrode is positive.

Alternatively, one of an ion and an electron may be selectively emitted from the raw material at the free end of the charged particle generating electrode by selectively generating a first electric field in which the charged particle generating electrode is positive and the charged particle extract electrode is negative and a second electric field in which the charged particle generating electrode is negative and the charged particle extract electrode is positive.

When an electron is emitted from the raw material, the raw-material supply section may supply the raw material having a work function lower than a work function of the charged particle generating electrode material. In such a case, the conditions such as temperature and electric field which are required for generating an electron of increased current density may be lowered.

Another aspect of the present invention provides a charged particle generating apparatus comprising: a charged particle generating electrode including a raw-material passage formed therethrough, the raw-material passage extending from a base end to a free end of the charged particle generating electrode; a raw-material supply section connected to the base end and supplying a raw material to the raw-material passage of the charged particle generating electrode; a charged particle extract electrode which generates an electric field between the charged particle extract electrode and the free end of the charged particle generating electrode; an electric-field-forming power supply section which generates a first electric field, in which the charged particle generating electrode is positive and the charged particle extract electrode is negative, in an ion generation mode, and generates a second electric field, in which the charged particle generating electrode is negative and the charged particle extract electrode is positive, in an electron generation mode; and a raw-material supply stopping section which stops the supply of raw material from the raw-material supply section in the electron generation mode.

In this aspect, the supply of raw material is cut off in the electron generation mode. Thus, an electron will be emitted from the charged particle generating electrode itself. In comparison with the case where different raw materials are used in the ion and electron generation modes, the control may be simplified only by stopping the supply of raw material.

The above aspects of the present invention may include a temperature controlling section which controls the temperature of the charged particle generating electrode. The provision of this temperature controlling section enables the supply of raw material to be controlled, the charged particle generating electrode to be cleaned, and the charged particle generating electrode to emit thermal electrons or thermal field emission electrons.

The charged particle generating electrode used in the above aspects of the present invention may have a tubular structure in which a hollow having a fine diameter is formed through the center thereof. Such a tubular electrode structure may be formed of carbon. Specifically, the tubular electrode structure may be formed by a single-wall nanotube (or carbon nanotube) having a cylindrical structure with a hexagonal carbon layer (graphite layer), or a nanofiber formed by a multiwall nanotube including nanotubes of different diameters. The cylindrical structure with a hexagonal carbon layer may be formed of amorphous carbon, polycrystalline carbon or monoatomic layer of carbon like "sumi" (Chinese ink) or amorphous carbon.

DETAILED DESCRIPTION OF THE EMBODIMENT

Embodiments of the present invention will now be described with reference to the drawings.

Structure of Charged Particle Generating Apparatus

Figure 1:
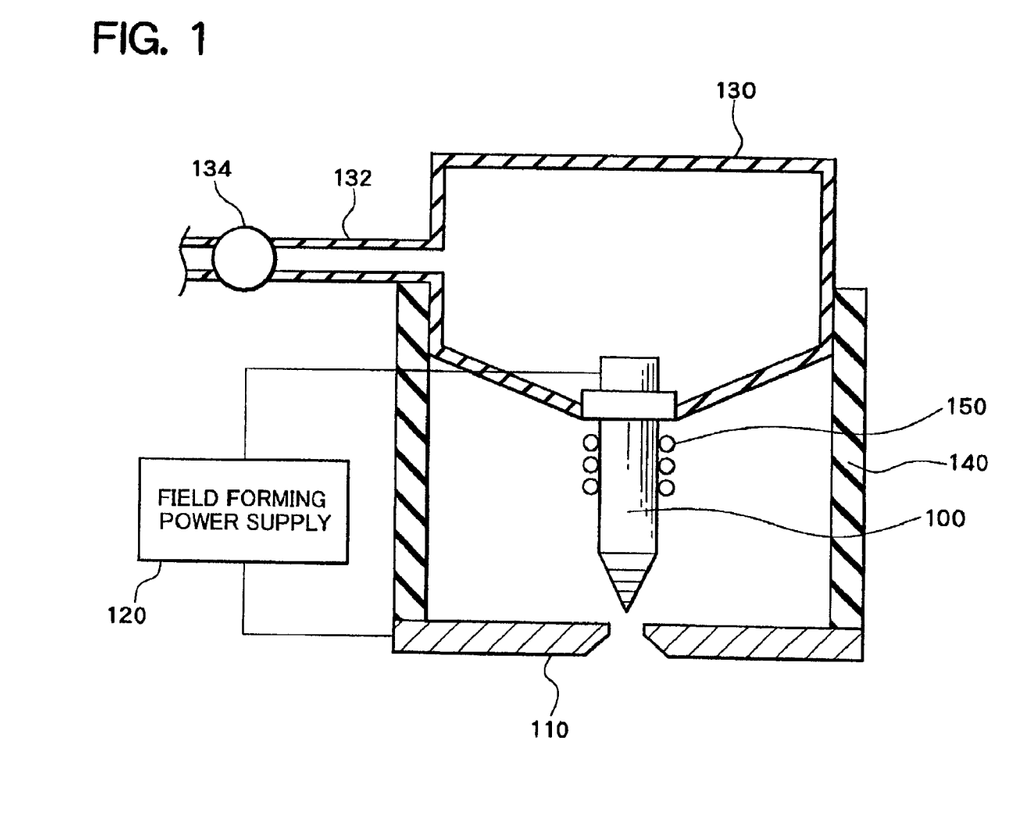
FIG. 1 is a schematically cross-sectional view of a charged particle generating apparatus according to one embodiment of the present invention.

FIG. 1 is a schematically view of a charged particle generating apparatus structured according to one embodiment of the present invention.

Referring to FIG. 1, the charged particle generating apparatus comprises a charged particle generating electrode 100, a charged particle extract electrode 110 and an electric-field-forming power supply section 120 for generating a strong electric field between the electrodes 100 and 110.

The charged particle generating electrode 100 is supported on a raw-material storage 130 which may be formed of insulator, for example. The raw-material storage 130 includes a raw-material supply port 132 which can be opened and closed by a valve 134.

The charged particle extract electrode 110 is supported on the raw-material storage 130 through an insulative electrode support 140.

Figure 2:
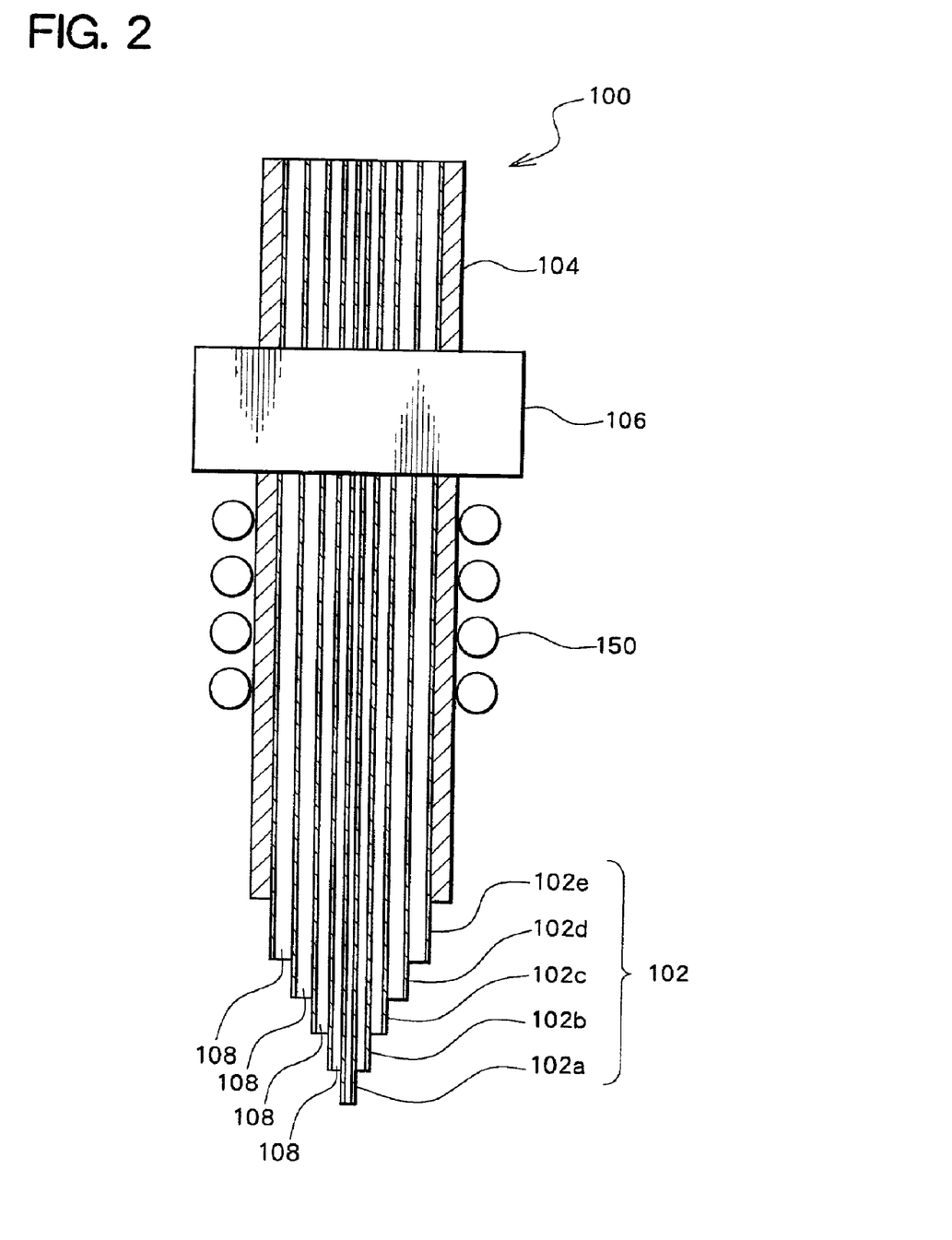
FIG. 2 is a schematically cross-sectional view, enlarged in scale, of the charged particle generating electrode shown in FIG. 1.

Although the raw-material storage 130 shown in FIG. 2 is formed of insulator, it may be formed of electrically conductive material. In such a case, the supply port 132 connected to the raw-material storage may be used as a high-voltage introduction terminal. Thus, the supply of high voltage to the charged particle generating electrode can be carried out through the raw-material storage 130.

FIG. 2 is a schematically cross-sectional view, enlarged in scale, of the charged particle generating electrode 100. In this figure, the charged particle generating electrode 100 may be formed by a multiwall carbon tube 102 of concentrically cylindrical configuration. FIG. 2 schematically shows five carbon tube layers 102a to 102e. The carbon tube 102 has a free needle-shaped end which may be configured by etching it with a solution of KOH, for example. On the outer periphery of the carbon tube 102, a plated layer 104 of Ta or Ni is formed. The plated layer 104 is removed at the free end of the carbon tube 102, for example, by wet-etching the free end with concentrated sulfuric acid or concentrated hydrochloric acid.

An electrode support 106 made of tungsten (W) or the like, is formed around the base end of the carbon tube 102 through welding, for example. The plated layer 104 serves as means for stable attaching of the electrode support 106 to the carbon tube 102.

This charged particle generating electrode may be formed by a carbon nanotube consisting of one or more single-wall or multiwall. In this case, the free end of the carbon nanotube can sufficiently function as a needle electrode without any machining since the diameter of the free end of a carbon nanotube is fine.

In such a manner, the charged particle generating electrode 100 is formed by the single-wall or multiwall carbon tube 102. The carbon tube 102 has a cylindrical structure with a hexagonal carbon layer. In the charged particle generating electrode 100, thus, the meshes of the carbon tube 102, the hollow of the cylinder and the gaps between the tubular layers function as a raw-material passage 108. In other words, the raw-material storage 130 can be connected by fluid transportation with the free end of the charged particle generating electrode 100 through the raw-material passage 108 in the charged particle generating electrode 100.

A temperature controlling section, such as a heater 150 is provided around the charged particle generating electrode 100. However, the heating may be carried out directly by passing electric current through the electrode or indirectly to the charged particle generating electrode 100.

Operation of the Charged Particle Generating Apparatus as an Ion Source

Figure 3:
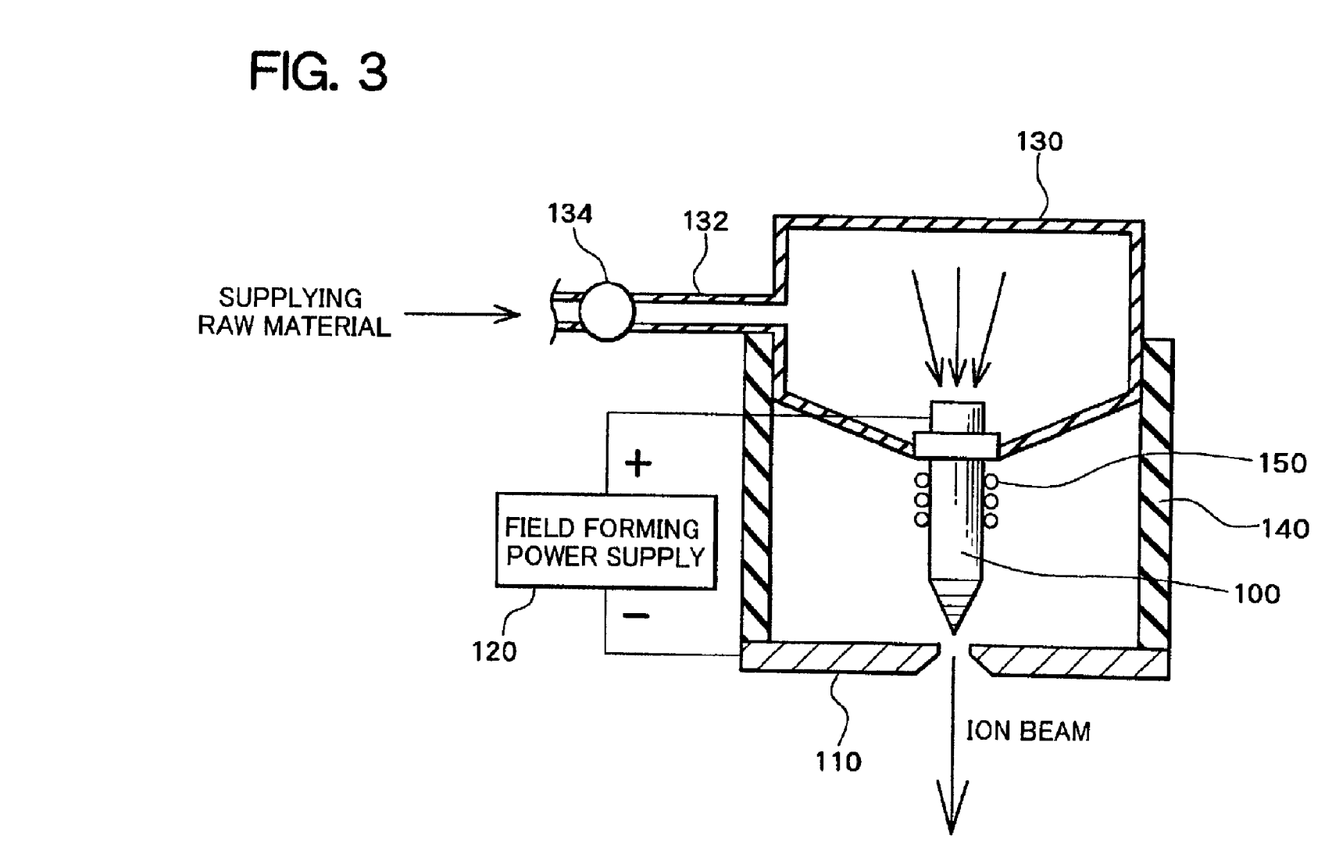
FIG. 3 illustrates the operation of the FIG. 1 apparatus when it is used as an ion source.

FIG. 3 illustrates the operation of the apparatus of FIG. 1 used as an ion source. To emit positive ions in the apparatus shown in FIG. 1, the electric-field-forming power supply section 120 generates a strong electric field in which the charged particle generating electrode 100 is positive and the charged particle extract electrode 110 is negative, as shown in FIG. 3.

The valve 134 is then opened to supply the raw material as ion species into the raw-material storage 130 through the supply port 132.

The ambient gas around the charged particle generating electrode 100 is controlled by evacuating the charged particle generating apparatus through a vacuum pump (not shown) down to about $10^{-8}$ Pa, for example.

This vacuum atmosphere communicates with the raw-material storage 130 through the raw-material passage 108 in the charged particle generating electrode 100.

Thus, the raw material in the raw-material storage 130 is diffused or moved from the base end to the free end of the charged particle generating electrode 100 through the raw-material passage 108 of the charged particle generating electrode 100 under the pressure difference.

The raw material diffused into the free end of the charged particle generating electrode 100 is ionized by the aforementioned strong electric field. The positive ions are by the charged particle extract electrode 110 to form an ion beam to be emitted from the charged particle generating apparatus.

The prior art required a tank of liquid helium or nitrogen or a refrigerator for liquefying the gaseous raw material around the charged particle generating electrode. However, this embodiment will not require any of these components.

Since the charged particle generating electrode 100 is formed by the carbon tube 102 providing the fine-diameter raw-material passage 108, almost all the raw material can be ionized without any waste.

The raw material to be supplied may be selected depending on the type of ion species to be emitted. If the charged particle generating apparatus is used as an ion source for ion injection device, the raw material can be selected depending on the type of ion species to be injected. When the work is machined by use of an ion beam and the type of ion species is not particularly specified, it is desirable that the raw material to be supplied is one having a reduced absolute value of work function, such as cesium (Cs) or barium (Ba) because it can ensure the desired electron current under a modified condition of temperature.

The velocity of the raw material passing through the raw-material passage 108 can be adjusted by suitably setting the temperature in the heater 150, in addition to the degree of vacuum in the chamber, or the supply pressure the raw material or the like.

Such a field ionization type ion source can be utilized for any of ion microanalyzer, ion-beam drawing device, exposure device for semiconductor lithography, scanning ion microscopy (SIM), mealing device, ion injection device and so on.

Figure 4:
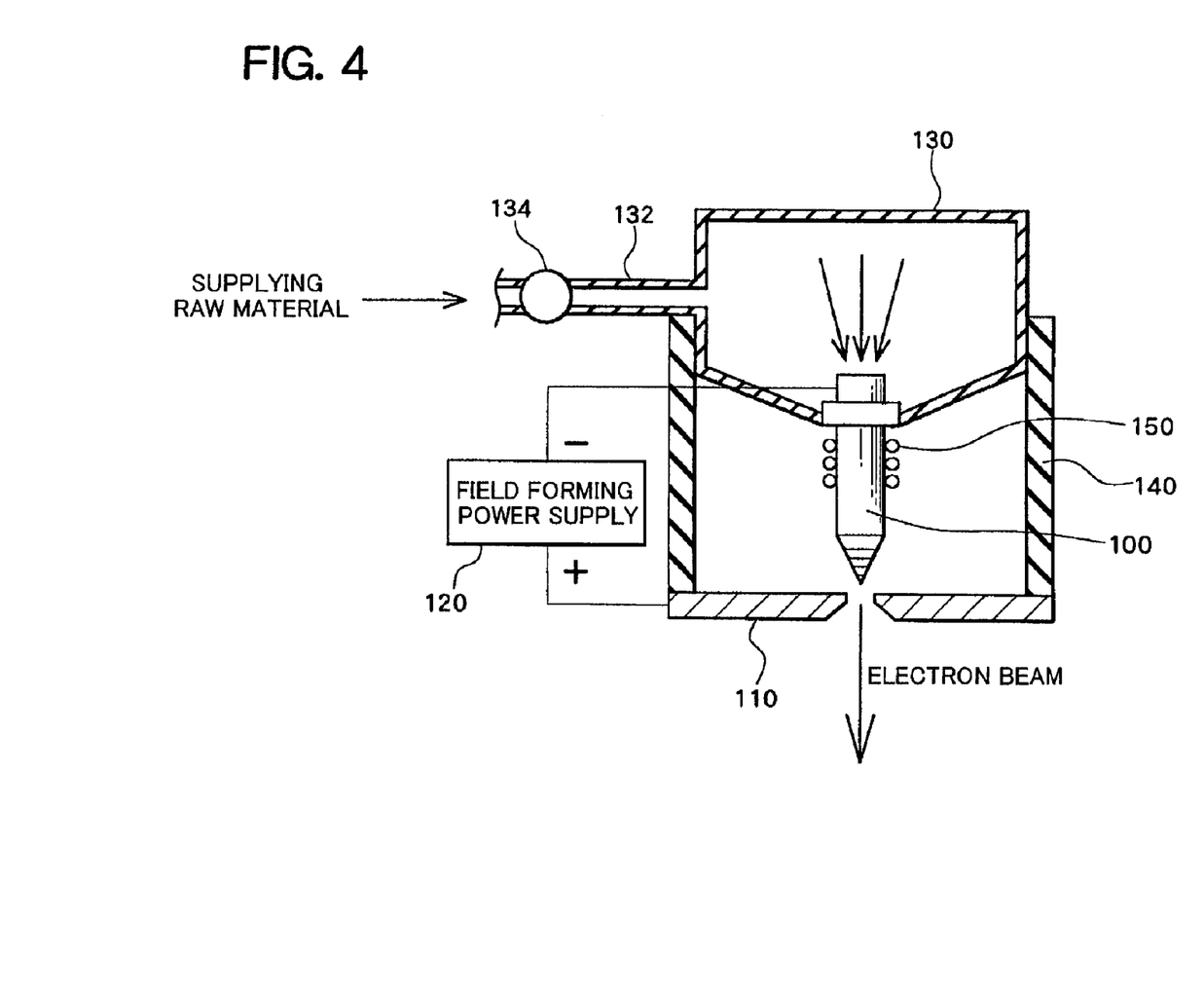
FIG. 4 is a view illustrating the operation of the FIG. 1 apparatus when it is used as an electron source.

Explanation 1 Relating to the Operation of the Charged Particle Generating Apparatus as an Electron Source FIG. 4 illustrates the operation of the apparatus of FIG. 1 as an electron source. To emit electrons in the apparatus of FIG. 1, the electric-field-forming power supply section 120 generates a strong electric field in which the charged particle generating electrode 100 is negative and the charged particle extract electrode 110 is positive, as shown in FIG. 4.

The valve 134 is then opened to supply the raw material into the raw-material storage 130 through the supply port 132. As in the case of the ion source, thus, the raw material in the raw-material storage 130 is diffused from the base end to the free end of the charged particle generating electrode 100 through the raw-material passage 108 in the charged particle generating electrode 100.

The raw material diffused to the free end of the charged particle generating electrode lowers the work function which increases electron emission under the aforementioned electric field at the temperature set by the heater 105 in the case of electron generation to generate electrons. The generated electrons are then accelerated by the charged particle extract electrode 110 to create an electron beam to be emitted from the charged particle generating apparatus. Moreover, the charged particle generating apparatus can emit the electrons even at a reduced electric field due to the reduced work function of the raw material itself.

In the prior art, the current density of the electron beam has been determined depending on the material of the charged particle generating electrode since the electrons are emitted directly from the charged particle generating electrode.

In this embodiment, the electrons can more easily be emitted under the reduced work function of the raw material on the tip of the electrode. Thus, the material of the charged particle generating electrode 100 may be carbon having a high corrosion resistance to various gaseous raw materials. The carbon has a high work function of 4.5 (V). The charged particle generating electrode of the prior art is popularly formed of tungsten (W). The tungsten has a work function substantially equal to that of the carbon, 4.54 (V). The tungsten (W) provides a current density of thermal electron emission of 2600 A/m$^2$ at the cathode temperature of 2500 K.

On the other hand, barium strontium (Ba/SrO) having a work function of 0.95 (V) may provide the current density of thermal electron emission equal to that of the tungsten (W) at the cathode temperature around 900 K that is about 1600 K lower than that of the tungsten.

The desirable property of the electron source is to emit electrons of a given energy as an electron beam which has an increased current density of electron beam and an improved coherence. This embodiment can realize a high-intensity emitter by increasing the current density of electron beam.

The carbon (C) used in the charged particle generating electrode of this embodiment as a material has a higher melting point and is superior in the corrosion resistance to various gases. However, the carbon has a work function of 4.5 (V) close to that of the tungsten. In order to use the carbon in the high-intensity emitter, an increased field intensity, a finer electrode tip or an increased temperature had been required.

This embodiment can realize a high-intensity emitter by forming the electrode surface covered with a raw material, having a work function lower than that of the carbon for forming the electrodes, such as barium (Ba) having a work function of 2.11 (V) or cesium (Cs) having a work function of 1.81 (V).

The prior art sometimes used an electrode of tungsten (W), the surface of which was coated with a material having a lower work function. For example, the electrode of W/Ba formed by coating tungsten (W) with barium (Ba) may have a work function of 1.56 (V). Similarly, the work function of W/Cs (cesium) may be 1.36 (V); the work function of W/Th (thorium) may be 2.63 (V); the work function of W/Y (yttrium) may be 2.70 (V); and the work function of W/Zr (zirconium) may be 3.14 (V). However, these electrodes had to be exchanged to new one at a time when the coated material of lower work function had been consumed.

The velocity of the raw material passing through the raw-material passage 108 can be adjusted by setting the temperature in the heater 150 in addition to the supply pressure of raw material, the pressure in the chamber and so on, as in the ion source.

Such an electron source may be utilized for scanning electron microscope (SEM), electron-beam drawing device, exposure device, X-ray microanalyzer and so on.

Operation of the Charged Particle Generating Apparatus as an Ion/Electron Source The operations shown in FIGS. 3 and 4 can alternately be carried out. In such a case, the direction of the electric field can be reversed at least. The raw material supplied may be changed if necessary, or may not necessarily be changed.

The prior art required to change the pressure between the in-chamber pressure of $10^{-2}$ Pa when the charged particle generating apparatus is used as the ion source and the pressure of $10^{-8}$ Pa when the charged particle generating apparatus is used as the electron source, by the use of a turbo-molecular pump or the like. In this embodiment, the in-chamber pressure will be substantially invariable even though the charged particle generating apparatus is used as the ion source or electron source. In other words, the dimension of the raw-material passage 108 in the charged particle generating electrode 100 is selected so that the pressure at the fee end of the charged particle generating electrode 100 will not substantially vary. Therefore, this embodiment does not require any large-sized pump as in the prior art.

Explanation 2 Relating to the Operation of the Charged Particle Generating Apparatus as an Electron Source In the case of using a single charged particle generating apparatus as ion and electron sources, the operation of the electron source is not restricted to the operation described in connection with FIG. 4.

Figure 5:
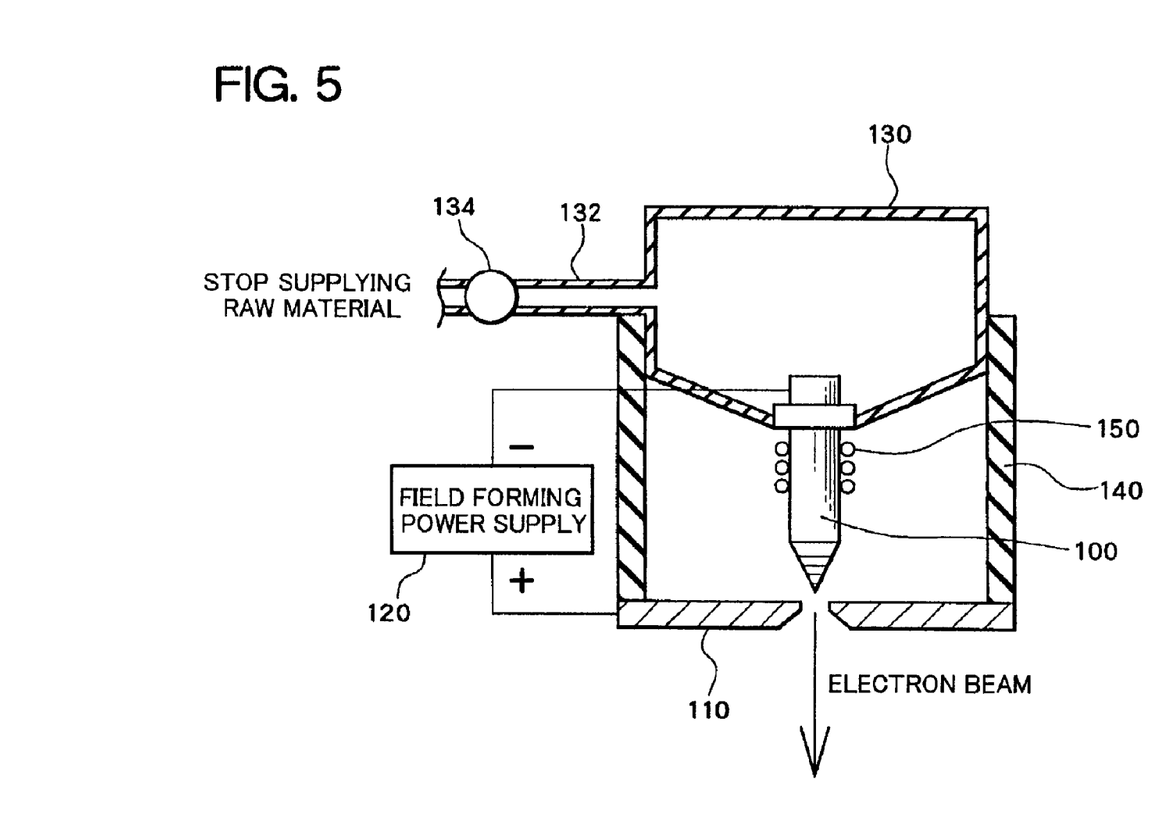
FIG. 5 is a view different from that of FIG. 4, illustrating the operation of the FIG. 1 apparatus when it is used as an electron source.

FIG. 5 shows another embodiment of the present invention in which the charged particle generating apparatus is operated as an electron source.

The formation of electric field in FIG. 5 is similar to that of FIG. 4 except that the supply of raw material is stopped. In this case, the electrons will be emitted from the charged particle generating electrode 100 itself which is formed of the carbon tube 102.

In this case, the charged particle generating electrode 100 has previously been heated by the heater 150 to remove the raw material and adhered to the free end thereof. Thus, the surface of the charged particle generating electrode 100 will be cleaned for proper emission of electrons.

Since the pressure around the charged particle generating electrode 100 will not almost vary, this embodiment does not also require any large-sized pump.

When the charged particle generating apparatus is been using as the electron source, the charged particle generating electrode 100 may be continued to be heated by the heater 150. Thus, the charged particle generating electrode 100 may be used as a thermal field emission type electron source.

In comparison with the case of FIG. 4 in which different raw materials are used for ion source and for electron source, the case of FIG. 5 can more easily accomplish the purpose only by opening/closing the valve 134. In the case of FIG. 4 wherein the different raw materials are used in ion and electron generation modes, for example, it is required to exhaust the raw-material storage 130 for preventing the raw materials from being mixed together.

The present invention is not limited to the aforementioned embodiments, but may be carried out in any of various other forms without departing from the scope and purpose of the invention.

For example, the structure of the charged particle generating electrode 100 is not limited to that of FIG. 2, but may take any of various other forms so far as it has the raw-material passage 108.

Figure 6:
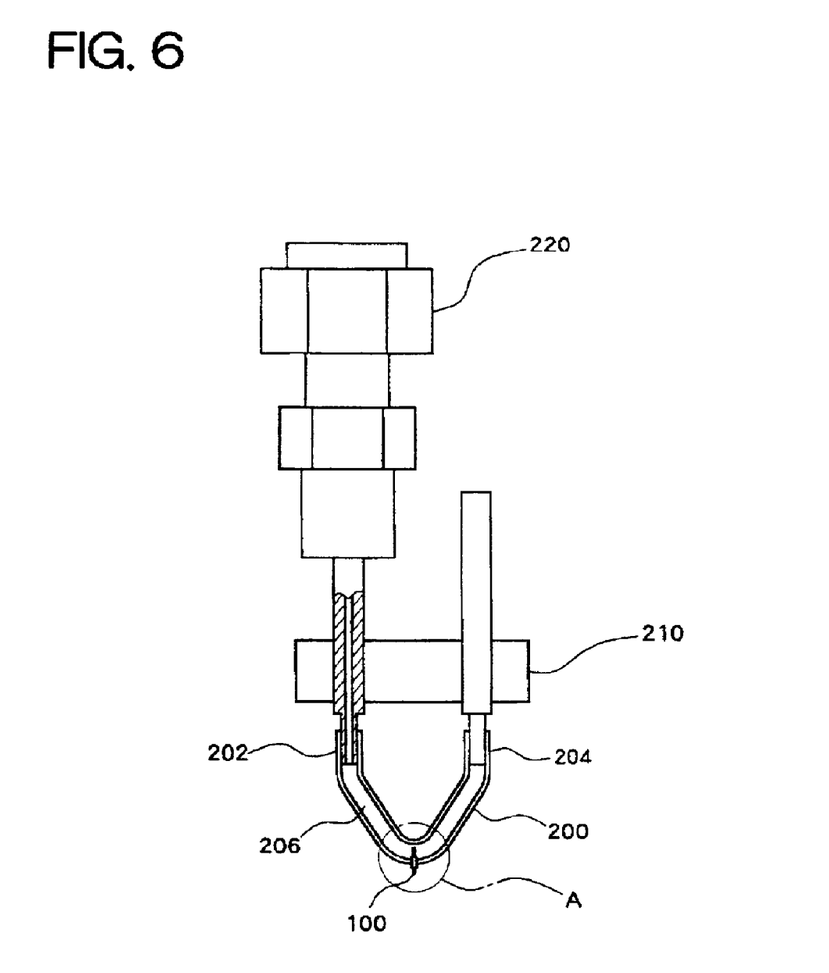
FIG. 6 is a schematically cross-sectional view of a charged particle generating apparatus according to another embodiment of the present invention.

The entire configuration of the charged particle generating apparatus as shown in FIG. 1 may be replaced by that of FIG. 6. Referring to FIG. 6, an insulator 210 supports a hollow raw-material storage 200 having an appearance similar to that of a hair-pin filament portion which has been used in the existing charged particle generating apparatus as a generation source. The hollow raw-material storage 200 has one end 202 to which the raw material from a raw-material supply port 220 is supplied, and the other end 204 being sealed. The raw material is supplied into a passage 206.

Figure 7:
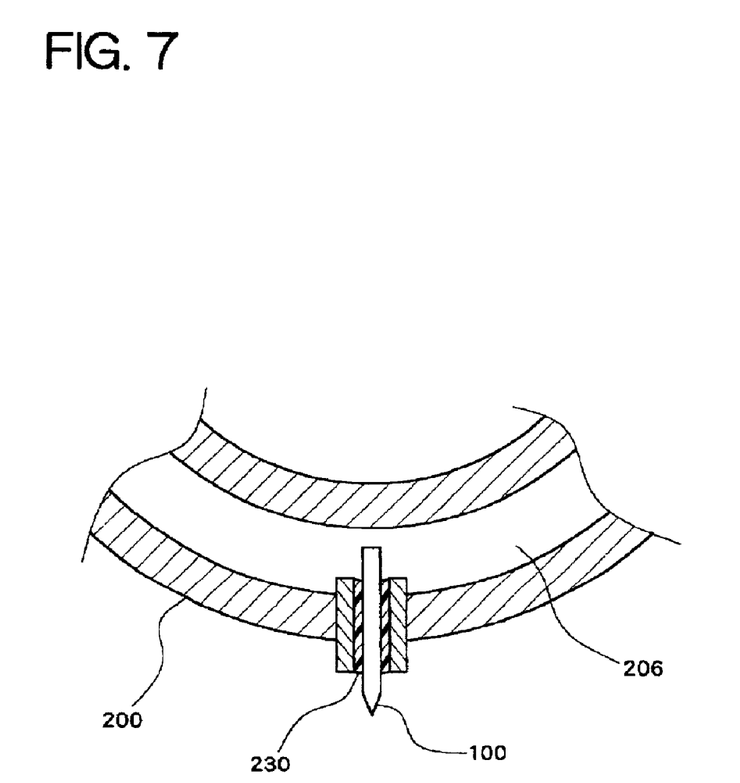
FIG. 7 is an enlarged view showing the part A in FIG. 6.

As shown in FIG. 7 which is an enlarged view relating to a part A in FIG. 6, the passage 206 firmly supports the charged particle generating electrode 100 formed by a carbon tube or the like, through a plated layer or conductive adhesive 230, for example. Even the structure of FIG. 6 can emit ions from the raw material introduced to the free end of the charged particle generating electrode 100 through the passage 206. The apparatus of FIG. 6 can also be used as an electron source as in the apparatus of FIG. 1. The raw-material storage 200 supporting the charged particle generating electrode 100 may be formed of metal (tungsten or the like) or carbon and be used for direct electron current heating the charged particle generating electrode 100.

What is claimed is:

1. A charged particle generating apparatus comprising:

a charged particle generating electrode including a raw-material passage formed therethrough, the raw-material passage extending from a base end to a free end of the charged particle generating electrode;

a raw-material supply section connected to the base end and supplying a raw material to the raw-material passage of the charged particle generating electrode; and a charged particle extract electrode which generates an electric field between the charged particle extract electrode and the free end of the charged particle generating electrode.

2. The charged particle generating apparatus according to claim 1, wherein an ion is emitted from the raw material at the free end of the charged particle generating electrode by generating the electric field in which the charged particle generating electrode is positive and the charged particle extract electrode is negative.

3. The charged particle generating apparatus according to claim 1, wherein an electron is emitted from the raw material at the free end of the charged particle generating electrode by generating the electric field in which the charged particle generating electrode is negative and the charged particle extract electrode is positive.

4. The charged particle generating apparatus according to claim 1, wherein one of an ion and an electron is selectively emitted from the raw material at the free end of the charged particle generating electrode by selectively generating a first electric field in which the charged particle generating electrode is positive and the charged particle extract electrode is negative and a second electric field in which the charged particle generating electrode is negative and the charged particle extract electrode is positive.

5. The charged particle generating apparatus according to claim 3, wherein when electron is emitted from the raw material, the raw-material supply section supplies the raw material having a work function lower than a work function of the charged particle generating electrode material.

6. The charged particle generating apparatus according to claim 1, further comprising a temperature controlling section which controls the temperature of the charged particle generating electrode.

7. The charged particle generating apparatus according to claim 1, wherein the charged particle generating electrode has a tubular structure.

8. The charged particle generating apparatus according to claim 7, wherein the charged particle generating electrode has a multiwall tubular structure.

9. The charged particle generating apparatus according to claim 1, wherein the charged particle generating electrode is formed by a carbon tube.

10. A charged particle generating apparatus comprising:

a charged particle generating electrode including a raw-material passage formed therethrough, the raw-material passage extending from a base end to a free end of the charged particle generating electrode;

a raw-material supply section connected to the base end and supplying a raw material to the raw-material passage of the charged particle generating electrode;

a charged particle extract electrode which generates an electric field between the charged particle extract electrode and the free end of the charged particle generating electrode;

an electric-field-forming power supply section which generates a first electric field, in which the charged particle generating electrode is positive and the charged particle extract electrode is negative, in an ion generation mode, and generates a second electric field, in which the charged particle generating electrode is negative and the charged particle extract electrode is positive, in an electron generation mode; and a raw-material supply stopping section which stops the supply of raw material from the raw-material supply section in the electron generation mode.

11. The charged particle generating apparatus according to claim 10, further comprising a temperature controlling section which controls the temperature of the charged particle generating electrode.

12. The charged particle generating apparatus according to claim 10, wherein the charged particle generating electrode has a tubular structure.

13. The charged particle generating apparatus according to claim 12, wherein the charged particle generating electrode has a multiwall tubular structure.

14. The charged particle generating apparatus according to claim 10, wherein the charged particle generating electrode is formed by a carbon tube.

\* \* \* \* \*